(12) United States Patent
Lu et al.

(10) Patent No.: US 10,248,255 B2
(45) Date of Patent: *Apr. 2, 2019

(54) ARRAY SUBSTRATE, TOUCH DISPLAY PANEL AND METHOD FOR CALCULATING TOUCH PRESSURE

(71) Applicants: SHANGHAI TIANMA MICRO-ELECTRONICS CO., LTD., Shanghai (CN); TIANMA MICRO-ELECTRONICS CO.,LTD., Shenzhen (CN)

(72) Inventors: Feng Lu, Shanghai (CN); Qijun Yao, Shanghai (CN); Liang Liu, Shanghai (CN); Shaolong Ma, Shanghai (CN); Yingteng Zhai, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/015,193

(22) Filed: Jun. 22, 2018

(65) Prior Publication Data

US 2018/0300012 A1 Oct. 18, 2018

Related U.S. Application Data

(63) Continuation-in-part of application No. 15/194,287, filed on Jun. 27, 2016, now Pat. No. 10,031,615.

(30) Foreign Application Priority Data

Dec. 25, 2015 (CN) .......................... 2015 1 0995693

(51) Int. Cl.
*G06F 3/041* (2006.01)
*H01L 27/12* (2006.01)
(Continued)

(52) U.S. Cl.
CPC .............. *G06F 3/0416* (2013.01); *G01L 1/18* (2013.01); *G06F 3/0412* (2013.01);
(Continued)

(58) Field of Classification Search
CPC ........ G06F 3/041–3/0416; G06F 3/044; G06F 3/047; G06F 2203/04105;
(Continued)

(56) References Cited

U.S. PATENT DOCUMENTS

2006/0043508 A1 3/2006 Ohta et al.
2013/0047747 A1 2/2013 Joung
(Continued)

FOREIGN PATENT DOCUMENTS

CN 102216885 A 10/2011

*Primary Examiner* — Nathan Danielsen
(74) *Attorney, Agent, or Firm* — Kilpatrick Townsend & Stockton LLP

(57) ABSTRACT

Provided are an array substrate, a touch display panel and a method for calculating touch pressure. The array substrate includes: a display region with a non-display region around the display region, thin film transistors in the display region and having an active layer, at least two semiconductor pressure sensors, a bias voltage applying circuit for applying a bias voltage to each semiconductor pressure sensor, and a voltage detecting circuit for acquiring a strain voltage from each semiconductor pressure sensor. A first straight line connecting a first connecting terminal and a second connecting terminal of the semiconductor pressure sensor intersects a second straight line connecting a third connecting terminal and a fourth connecting terminal of the semiconductor pressure sensor. The semiconductor pressure sensor
(Continued)

is a semiconductor film in a polygonal structure having at least four sides, the active layer and the semiconductor film are in a same layer.

20 Claims, 12 Drawing Sheets

(51) Int. Cl.
*G01L 1/18* (2006.01)
*G06F 3/044* (2006.01)
*G06F 3/045* (2006.01)
*G06F 3/042* (2006.01)

(52) U.S. Cl.
CPC .......... *H01L 27/1214* (2013.01); *G06F 3/044* (2013.01); *G06F 3/045* (2013.01); *G06F 3/0421* (2013.01); *G06F 2203/04105* (2013.01)

(58) Field of Classification Search
CPC . G06F 2203/04106; G06F 2203/04111; G06F 2203/04113; H01L 27/12; H01L 27/1214; H01L 27/124; H01L 27/1251
See application file for complete search history.

(56) References Cited

U.S. PATENT DOCUMENTS

| | | |
|---|---|---|
| 2013/0215056 A1 | 8/2013 | Johansson et al. |
| 2014/0152921 A1* | 6/2014 | Yashiro .................. G06F 3/044 349/12 |

\* cited by examiner

ARRAY SUBSTRATE, TOUCH DISPLAY PANEL AND METHOD FOR CALCULATING TOUCH PRESSURE

CROSS-REFERENCES TO RELATED APPLICATIONS

This application is a Continuation-In-Part of U.S. application Ser. No. 15/194,287, filed on Jun. 27, 2016, which claims priority to Chinese Application No. CN201510995693.7 filed on Dec. 25, 2015, which are herein incorporated by reference in their entireties.

TECHNICAL FIELD

The present application relates to touch technologies, and in particular to an array substrate, a touch display panel and a method for calculating touch pressure.

BACKGROUND

At present, more and more electronic devices are provided with touch display panels, such as an information inquiring machine in a hall of a public place, a computer and a cell phone which are used in daily life and work for users and the like. Electronic devices can be operated by touching identifications on touch display panels by fingers of users, being free from keyboards and mice, so that man-machine interaction is more direct. In order to meet requirements of users better, generally, a touch display panel is internally provided with a pressure sensor for detecting the amount of touch pressure in the process of touching touch display panels by users.

In the related art, a piezoresistive pressure sensor used in a touch display panel is mainly formed by connecting strain electrical gauges according to a Wheatstone bridge principle. The kind of sensors is low in piezoresistive coefficient, so that enough strong signals can be detected only when the sizes of the sensors are enough large, but the larger the size of the pressure sensor is, the more difficult it is to integrate the pressure sensor into a touch display panel.

SUMMARY

In view of this, the disclosure provides a touch substrate, a touch display panel and a method for calculating touch pressure so as to solve the problem that a pressure sensor of the related art is difficult to be integrated inside a touch display panel.

In a first aspect, an embodiment provides an array substrate. The array substrate includes: a display region with a non-display region around the display region; thin film transistors in the display region and having an active layer; at least two semiconductor pressure sensors, each of which has a first connecting terminal, a second connecting terminal, a third connecting terminal and a fourth connecting terminal; a bias voltage applying circuit; and a voltage detecting circuit.

A first straight line connecting the first connecting terminal and the second connecting terminal intersects a second straight line connecting the third connecting terminal and the fourth connecting terminal.

The bias voltage applying circuit is electrically connected to the first connecting terminal and the second connecting terminal of each semiconductor pressure sensor, and is adapted for applying a bias voltage to each semiconductor pressure sensor.

The voltage detecting circuit is electrically connected to the third connecting terminal and the fourth connecting terminal of each semiconductor pressure sensor, and is adapted for acquiring a strain voltage between the third connecting terminal and the fourth connecting terminal of each semiconductor pressure sensor.

Each of the at least two semiconductor pressure sensors is a semiconductor film in a polygonal structure having at least four sides, the active layer and the semiconductor film are in a same layer.

In a second aspect, an embodiment provides a touch display panel including the above array substrate and a touch detecting circuit for acquiring a touch detecting signal of the touch display panel.

In a third aspect, an embodiment provides a method for calculating touch pressure, and the method for calculating touch pressure includes:

acquiring, by the processor, a touch detecting signal detected by a touch detecting circuit, and acquiring, by the processor, touch position information of the touch display panel according to the touch detecting signal;

acquiring, by the processor, the strain voltage difference of the semiconductor pressure sensors; and calculating, by the processor, the mount of the touch pressure according to the touch position information of the touch display panel and the strain voltage difference of the semiconductor pressure sensors.

According to the embodiments, at least two semiconductor pressure sensors are utilized on a touch substrate, thus solving the problem that in the process of a touch substrate with a pressure sensor, in order to enable the strain signal intensity of the sensor to be strong enough, the size of the pressure sensor is required to be manufactured to be very large, consequently the pressure sensor is difficult to be integrated into a touch display panel. Semiconductor pressure sensors adopted in the embodiments have the advantages of small size and are easy to be integrated into a touch display panel. In addition, the semiconductor pressure sensors provided by the embodiments also have relatively high strain voltage and the advantage of automatic temperature compensation, and are made of the same material with a silicon film layer in the touch substrate and fabricated with the silicon film layer in the touch substrate in the same manufacturing step, thus effectively reducing a procedure for forming a silicon film, simplifying the process of the array substrate, and reducing the manufacturing cost.

DETAILED DESCRIPTION

The disclosure is further described in detail in conjunction with accompanying drawings and embodiments. It should be understood that the particular embodiments described here are only used for explaining the disclosure, rather than limiting thereto. In addition, it also should be noted that parts relevant to the disclosure, rather than the whole structure, are merely shown in the accompanying drawings for the convenience of description.

Figure 1:
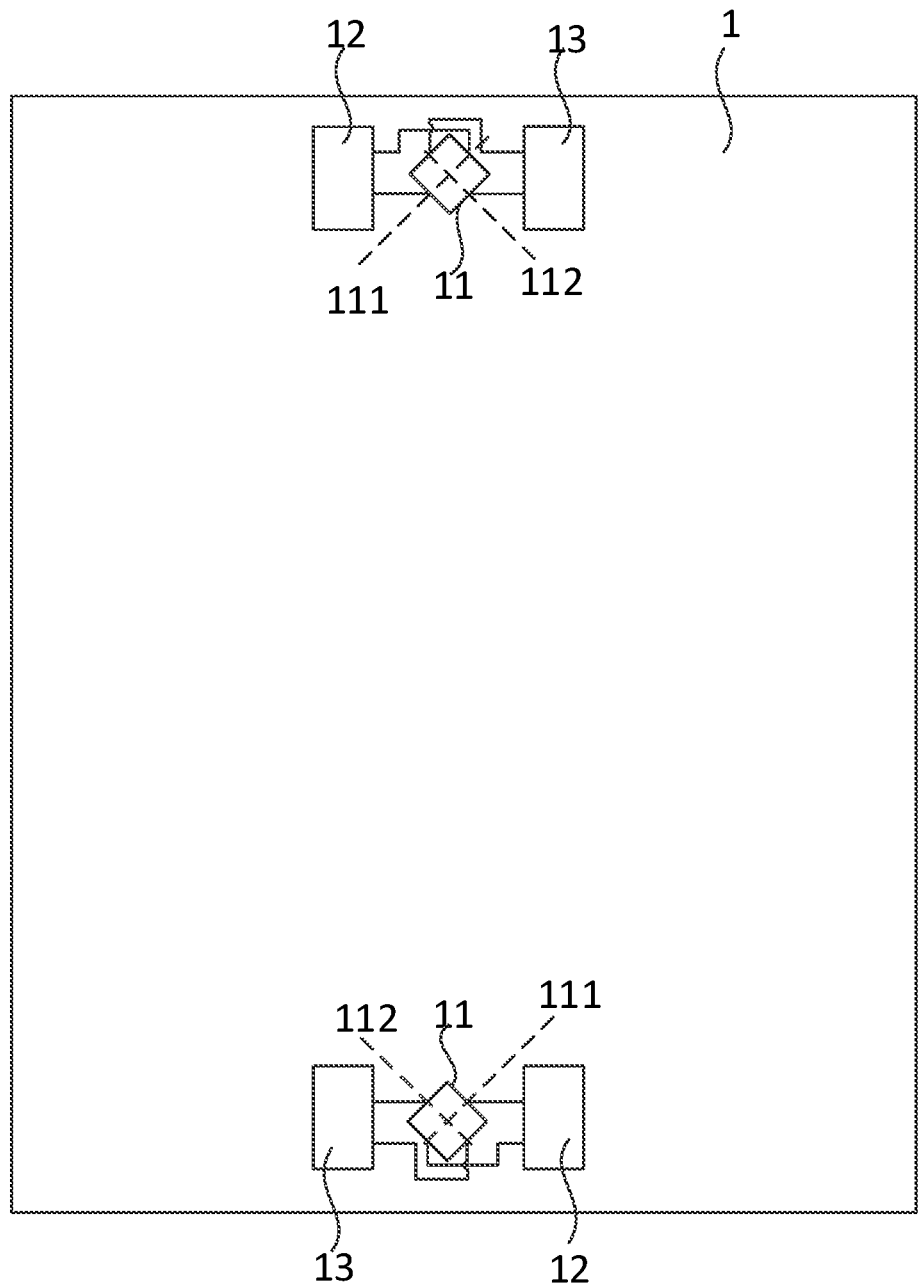
FIG. 1 is a structure schematic diagram showing a touch substrate provided by an embodiment of the disclosure.
Figure 2:
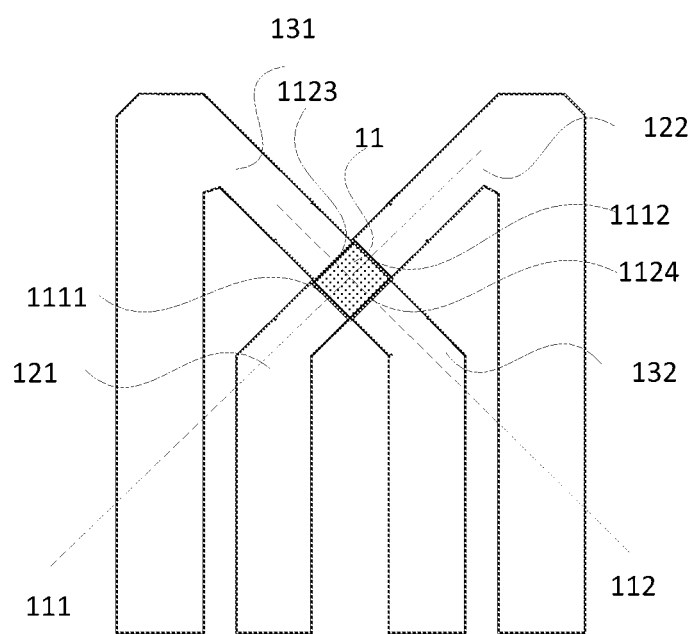
FIG. 2 is a connecting schematic diagram showing a pressure sensor configured on the touch substrate in FIG. 1.

FIG. 1 is a structure schematic diagram of the touch substrate provided by an embodiment of the disclosure. FIG. 2 is a connecting schematic diagram of a pressure sensor configured on the touch substrate in FIG. 1. The touch substrate shown in FIG. 1 and FIG. 2 is an array substrate. Referring to FIG. 1 and FIG. 2 please, the touch substrate 1 includes at least two semiconductor pressure sensors 11, two bias voltage applying circuits 12 and two voltage detecting circuits 13. Each of the bias voltage applying circuits 12 is electrically connected with a first connecting terminal 1111 and a second connecting terminal 1112 of a respective one of semiconductor pressure sensors 11, and is used to apply bias voltages to the respective one of semiconductor pressure sensors 11. Each of the voltage detecting circuits 13 is electrically connected with a third connecting terminal 1123 and a fourth connecting terminal 1124 of a respective one of the semiconductors 11, and is used for acquiring strain voltages of the respective one of the semiconductor pressure sensors 11. The first straight line 111 connecting the first connecting terminal 1111 and the second connecting terminal 1112 intersects the second straight line 112 connecting the third connecting terminal 1123 and the fourth connecting terminal 1124.

The semiconductor pressure sensors 11 are diffused silicon piezoresistive pressure sensors. Further illustratively, the semiconductor pressure sensors 11 are four-terminal diffused silicon piezoresistive pressure sensors which are formed by forming strain resistance gauges on a silicon wafer by ion implantation process and then packaging the same. Compared with a pressure sensor of the related art configured in a touch substrate, the above semiconductor pressure sensors have the advantages of high output, small size, automatic temperature compensation and the like, and are easier to be integrated on the touch substrate. If the semiconductor pressure sensors are integrated on the touch substrate, the semiconductor pressure sensors are small in coverage area, and are high in sensitivity of sensing the touch pressure. Polysilicon pressure sensors are used in the present disclosure. The polysilicon pressure sensor can be equivalent to a bridge. Due to the small size of the polysilicon pressure sensor, in the case that the whole polysilicon pressure sensor sensing temperature variations, the changing ration of the resistance of each part of the polysilicon pressure sensor is equal. And the output voltage is not affected by the temperature, so temperature compensation is achieved. Because the polysilicon pressure sensor is used in the present disclosure and the resistance of the polysilcion is much greater than the resistance of metal, the proportion of resistance of the wirings in the bias voltage applying circuit and voltage detecting circuit to the total resistance descends. Consequently, the influence of the strain and temperature variation of the wirings on the output voltage is reduced, and better temperature compensation is achieved.

The working principle of the semiconductor pressure sensors are described below in conjunction with FIG. 2. As shown in FIG. 2, each bias voltage applying circuit 12 includes a first electrode 121 and a second electrode 122. The first electrode 121 is electrically connected with the first connecting terminal 1111. The second electrode 122 is electrically connected with the second connecting terminal 1112. Each voltage detecting circuit 13 includes a third electrode 131 and a fourth electrode 132. The third electrode 131 is electrically connected with the third connecting terminal 1123, and the fourth electrode 132 is electrically connected with the fourth connecting terminal 1124. The first electrode 121 and the second electrode 122 are used for applying bias voltage to the semiconductor pressure sensor 11. The third electrode 131 and the fourth electrode 132 are used for acquiring strain voltages of the semiconductor pressure sensor 11.

It should be noted that, in FIG. 2, the semiconductor pressure sensor 11 is of a quadrilateral shape. The first electrode 121 and the second electrode 122 in the bias voltage applying circuit 12 are metal electrodes, and are electrically connected with a first connecting terminal 1111 and a second connecting terminal 1112 on two opposite sides of the semiconductor pressure sensor 11 respectively. Moreover, the third electrode 131 and the fourth electrode 132 in the voltage detecting circuit 13 are both metal electrodes, and are electrically connected with the third connecting terminal 1123 and the fourth connecting terminal 1124 on two additional opposite sides of the semiconductor pressure sensor 11 respectively.

In particular application, after bias voltage is applied to the semiconductor pressure sensor 11 by utilizing the bias voltage applying circuit 12, (namely, through the first electrode 121 and the second electrode 122), when fingers touch the touch substrate, the whole touch substrate is deformed, and the impedance of the strain resistor gauges is changed correspondingly, so that the strain voltages are changed correspondingly, therefore, the strain voltages of the semiconductor pressure sensor 11 can be acquired by utilizing the voltage detecting circuit 13, (namely, through the third electrode 131 and the fourth electrode 132), thereby determining (measuring) the amount of touch pressure. The measurement of the amount of the touch pressure can be applied in touch operations, such as touch, release or drag or drop.

In the measurement, three points are required to be noted:

Firstly, when the bias voltages are applied to the semiconductor pressure sensors 11 by utilizing the bias voltage applying circuits 12, the first electrode 121 or the second electrode 122 may be used as bias voltage input terminal. If the first electrode 121 is used as the bias voltage input terminal, the second electrode 122 may be grounded; if the second electrode 122 is used as the bias voltage input terminal, the first electrode 121 may be grounded.

Secondly, when the strain voltages of the semiconductor pressure sensors 11 are measured by utilizing the voltage detecting circuits 13, the strain voltage of the third electrode 131 and the strain voltage of the fourth electrode 132 are acquired respectively. After the strain voltage of the third electrode 131 and the strain voltage of the fourth electrode 132 are acquired, a processor (not shown in FIG. 2) connected with the voltage detecting circuits 13 calculates according to the strain voltages obtained from the third electrode 131 and the fourth electrode 132 to obtain the strain voltage difference between the third electrode 131 and the fourth electrode 132, and further calculates according to the strain voltage difference to obtain the amount of touch pressure.

Thirdly, the touch substrate requires at least two semiconductor pressure sensors so as to obtain the amount of touch pressure when the touch substrate is touched by fingers. The substrate glass is deformed when being touched by fingers, and each portion of the deformed touch substrate can generate shear force. If the touch substrate is only provided with only one semiconductor pressure sensor, only one semiconductor pressure sensor is subjected to the effect of the shear force from the portion in which the semiconductor pressure sensor locates, and the impedance of the strain resistor gauges in the semiconductor pressure sensors is changed. The strain voltages of the semiconductor pressure sensor is then changed. Meanwhile, the value of the amount of pressure measured according to the strain voltages is an amount of the shear force from the portion, in which the semiconductor pressure sensor is located, of the touch substrate, but not the amount of actual touch pressure inputted by users. Only when two or more semiconductor pressure sensors are disposed on the touch substrate, the value of the amount of the touch pressure can be calculated based on the amount of shear force measured by each semiconductor pressure sensor and the touch position information.

There are multiple connection modes of the semiconductor pressure sensors. In FIG. 2, the semiconductor pressure sensor 11 is a quadrilateral pressure sensor. The first electrode 121, the second electrode 122, the third electrode 131 and the fourth electrode 132 are respectively connected with four sides of the semiconductor pressure sensor 11.

Figure 3:
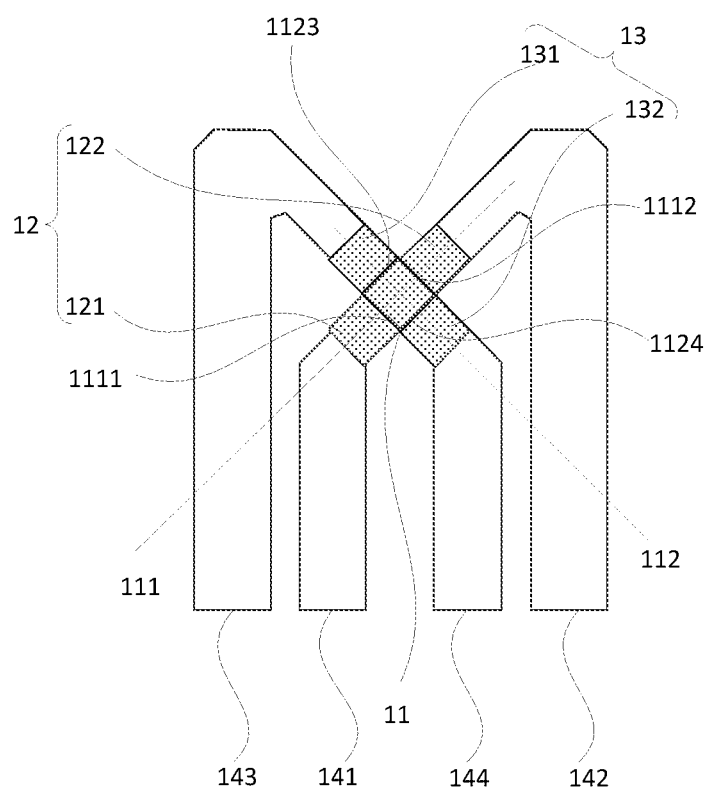
FIG. 3 is a connecting schematic diagram showing another pressure sensor configured on the touch substrate in FIG. 1.

FIG. 3 shows a connecting schematic diagram of another semiconductor pressure sensor. In FIG. 3, the semiconductor pressure sensor 11 is a quadrilateral pressure sensor. A first connecting terminal 1111, a second connecting terminal 1112, a third connecting terminal 1123 and a fourth connecting terminal 1124 are arranged on a respective side of the quadrilateral structure respectively. The bias voltage applying circuit includes a first electrode 121 and a second electrode 122 which are respectively electrically connected with the first connecting terminal 1111 and the second connecting terminal 1112 on two opposite sides of the semiconductor pressure sensor 11. The voltage detecting circuit 13 includes a third electrode 131 and a fourth electrode 132 which are respectively electrically connected with the third connecting terminal 1123 and the fourth connecting terminal 1124 on the other two opposite sides of the semiconductor pressure sensor 11. Different from the embodiment of the FIG. 2, the four electrodes and the semiconductor pressure sensor are made of same material. The arrangement can effectively eliminate the schottky barriers between the first electrode 121, the second electrode 122, the third electrode 131 and the fourth electrode 132 and the semiconductor pressure sensor, and can further enhance the sensitivity of the semiconductor pressure sensor. In addition, as shown in FIG. 3, the four electrodes are respectively externally connected with corresponding metal electrodes, (namely, a first metal electrode 141 is arranged at the external of the first electrode 121, a second metal electrode 142 is arranged at the external of the second electrode 122, a third metal electrode 143 is arranged at the external of the third electrode 131 and a fourth metal electrode 144 is arranged at the external of the fourth electrode 132). The first metal electrode 141, the second metal electrode 142, the third metal electrode 143 and the fourth metal electrode 144 are arranged for the purpose of electrically connecting and transmitting signals between the semiconductor pressure sensor 11 and other circuits (such as a processor) on the touch substrate 1 conveniently. It should be noted that these are only two specific examples provided by the embodiments of the disclosure, rather than limiting the disclosure. In specific designs, the semiconductor pressure sensor 11 can be a polygonal structure including at least four sides, and the first electrode 121, the second electrode 122, the third electrode 131 and the fourth electrode 132 are respectively connected with a respective side of the semiconductor pressure sensor 11 electrically. Typically, the first straight line 111 of the first connecting terminal 1111 and the second connecting terminal 1112 are orthogonal with the second straight line 112 of the third connecting terminal 1123 and the fourth connecting terminal 1124.

According to the embodiment of the disclosure, by utilizing the semiconductor pressure sensors on the touch substrate, the problem of the related art that in the manufacturing process of a touch substrate with a pressure sensor, in order to enable the strain signal intensity of the sensor to be strong enough, the size of the pressure sensor is required to be manufactured to be very large, resulting in the difficulty to integrate the sensor into a touch display panel is solved.

It should be noted that the touch substrate provided by the embodiment of the disclosure can be used for manufacturing liquid crystal displays or organic light-emitting diode displays and the like. If the touch substrate is used for manufacturing liquid crystal displays or organic light-emitting diode displays and the like, the touch substrate is required to be divided into a display region and a non-display region around the display region. After the touch substrate is divided into the display region and the non-display region, the semiconductor pressure sensors, the bias voltage applying circuits and the voltage detecting circuits can all be arranged in the display region, and also can be arranged in the non-display region, or one parts of the semiconductor pressure sensors, the bias voltage applying circuits and the voltage detecting circuits are arranged in the display region, and the other parts of the semiconductor pressure sensors, the bias voltage applying circuits and the voltage detecting circuits are arranged in the non-display region.

Figure 4:
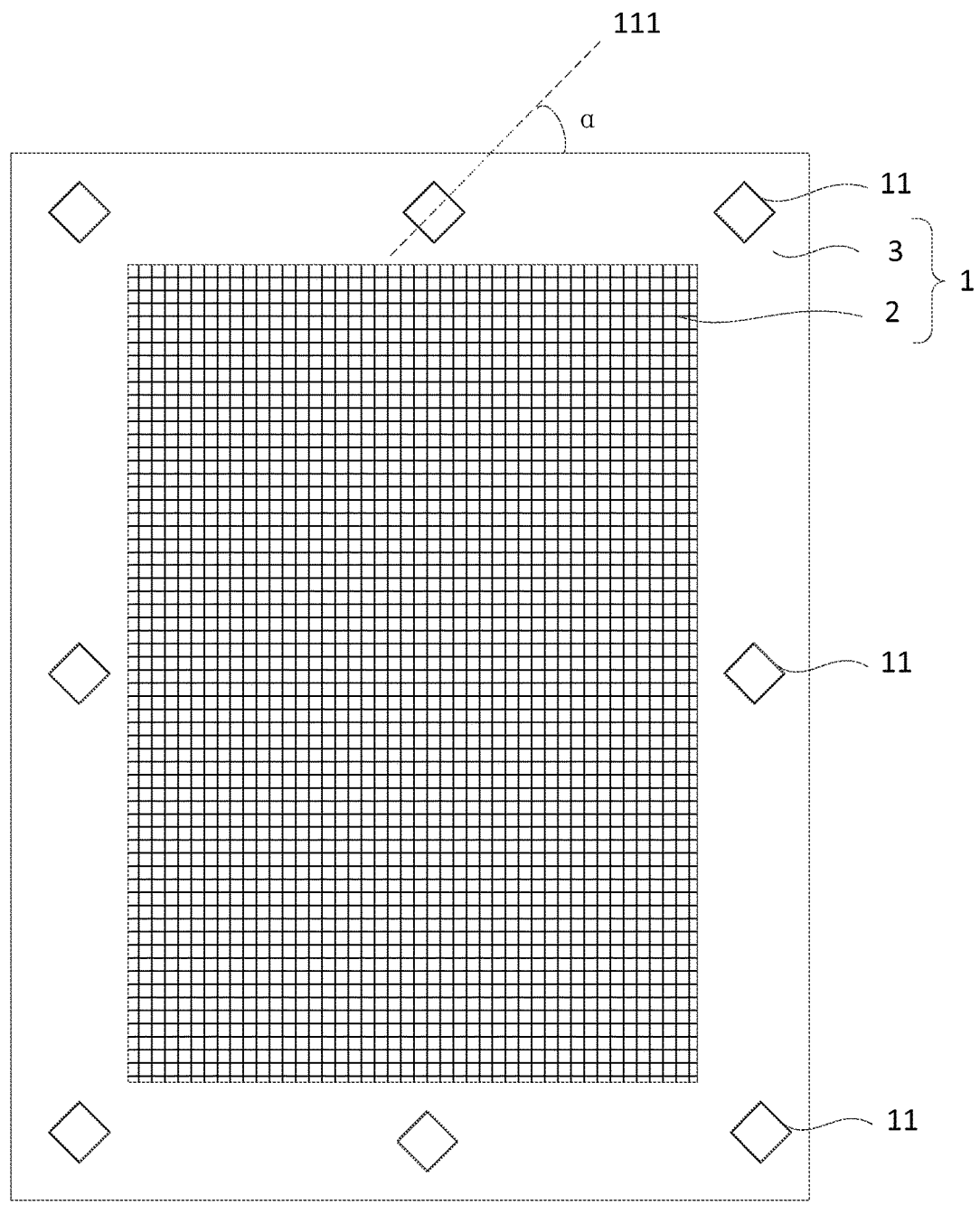
FIG. 4 is a structure schematic diagram showing another touch substrate provided by an embodiment of the disclosure.

Further, in order to prevent the display effect of the display region in the touch substrate from being affected by the semiconductor pressure sensors, in an embodiment, as shown in FIG. 4, the touch substrate 1 also includes a display region 2 and a non-display region 3 around the display region 2, and at least two semiconductor pressure sensors 11 are arranged in the non-display region 3 (in FIG. 4, the bias voltage applying circuits 12 and the voltage detecting circuits 13 which are electrically connected with the semiconductor pressure sensors 11 are omitted). Illustratively, the display region 2 is rectangular, and the outer sides of the four sides of the display region 2 are all provided with semiconductor pressure sensors 11.

There are multiple methods for configuring the semiconductor pressure sensors 11 in the non-display region 3 of the touch substrate 1. As shown in FIG. 4, the non-display region 3 of the touch substrate 1 is provided with a plurality of semiconductor pressure sensors 11. Some of the semiconductor pressure sensors 11 are arranged at the outer sides of four sides of the display region 2 of the touch substrate 1, and some of the semiconductor pressure sensors 11 are arranged at the outer sides of four angles of the display region 2. In a particular arrangement, the semiconductor pressure sensors 11 can be completely or partially arranged at the outer sides of four sides of the display region 2 of the touch substrate 1, and also can be completely or partially arranged at the outer sides of four angles of the display region 2, and the plurality of semiconductor pressure sensors 11 can be symmetrically arranged, and also can be asymmetrically arranged.

Figure 5:
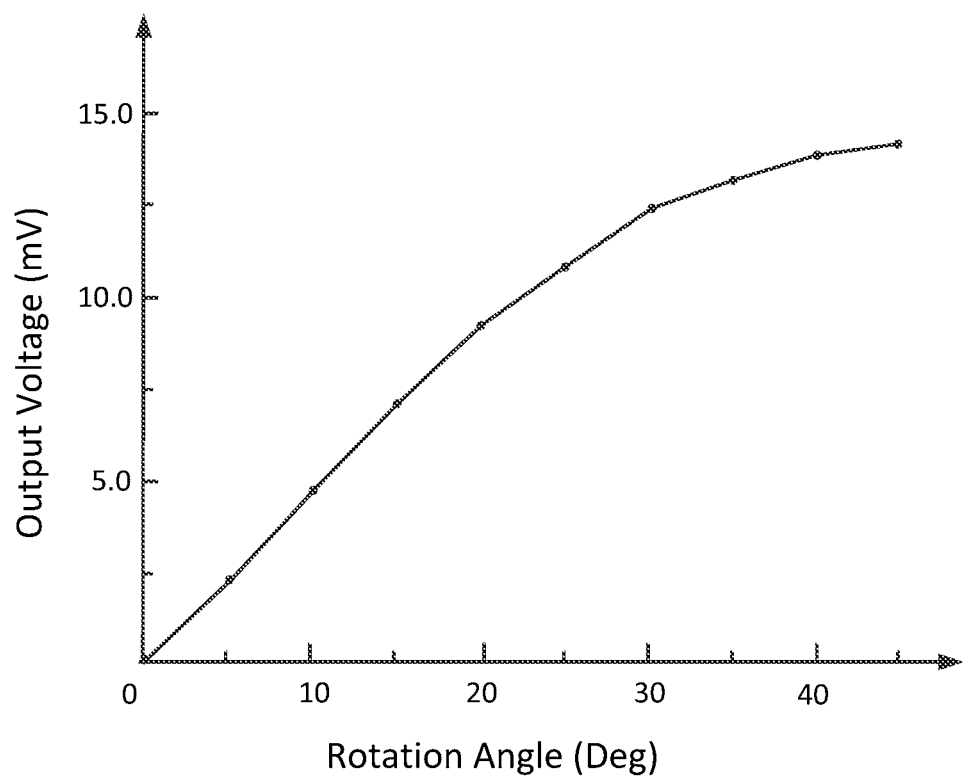
FIG. 5 is a diagram showing the relationship between the strain voltage difference of the semiconductor pressure sensor and the variation of an included angle between an edge of the touch substrate adjacent to the semiconductor pressure sensor and the first straight line.

In addition, in particular design, an included angle $\alpha$ of the edge of the touch substrate adjacent to the semiconductor pressure sensors 11 and the first straight line 111 ranges from 10 degrees to 80 degrees. Supposing that the bias voltage applying circuit 12 is used for applying 5V of bias voltage to the semiconductor pressure sensors 11, the touch pressure with specific amount is inputted to the touch substrate 1, and the strain voltage difference of the semiconductor pressure sensors 11 can be obtained by a simulation method, and the result is shown in FIG. 5. In FIG. 5, the x-coordinate denotes the size of the included angle $\alpha$ (Rotation Angle) between the edge of the touch substrate 1 adjacent to the semiconductor pressure sensor 11 and the first straight line 111, and the y-coordinate denotes the strain voltage difference (Output Voltage) outputted by the semiconductor pressure sensor. From FIG. 5, it is convincible that the strain voltage difference is increased as the increase of the included angle $\alpha$ between the edge of the touch substrate 1 adjacent to the semiconductor pressure sensor 11 and the first straight line 111. This shows that the included angle $\alpha$ between the edge of the touch substrate 1 adjacent to the semiconductor pressure sensor 11 and the first straight line 111 of the semiconductor pressure sensor 11 can affect the sensitivity of the semiconductor pressure sensor 11 for recognizing the amount of the touch pressure. In specific design, appropriate size of the included angle $\alpha$ between the edge of the touch substrate 1 adjacent to the semiconductor pressure sensor 11 and the first straight line 111 of the semiconductor pressure sensor 11 can be selected according to the design requirement.

Furthermore, when the non-display region 3 of the touch substrate 1 is provided with a plurality of semiconductor pressure sensors 11, and the touch substrate 1 can be provided with a plurality of bias voltage applying circuits 12 (not shown in FIG. 4), and the number of the bias voltage applying circuits 12 is equal to the number of the semiconductor pressure sensors 11. And each bias voltage applying circuit 12 is respectively corresponding to a semiconductor pressure sensor 11, so that the bias voltage is applied to each semiconductor pressure sensor 11 by the corresponding bias voltage applying circuit 12. The touch substrate 1 also can be provided with one or more bias voltage applying circuits 12 (namely, the number of the bias voltage applying circuits 12 is less than that of the semiconductor pressure sensors 11), i.e., each bias voltage applying circuit 12 is respectively corresponding to one or more semiconductor pressure sensors 11. Therefore, the bias voltage is applied to each semiconductor pressure sensor 11 by the corresponding bias voltage applying circuit 12.

Similarly, when the non-display region 3 of the touch substrate 1 is provided with a plurality of semiconductor pressure sensors 11, the number of the voltage detecting circuits 13 (not shown in FIG. 4) arranged on the touch substrate 1 is equal to or less than that of the semiconductor pressure sensors 11, and the strain voltage of each semiconductor pressure sensor 11 is measured by the corresponding voltage detecting circuit 13.

Figure 6:
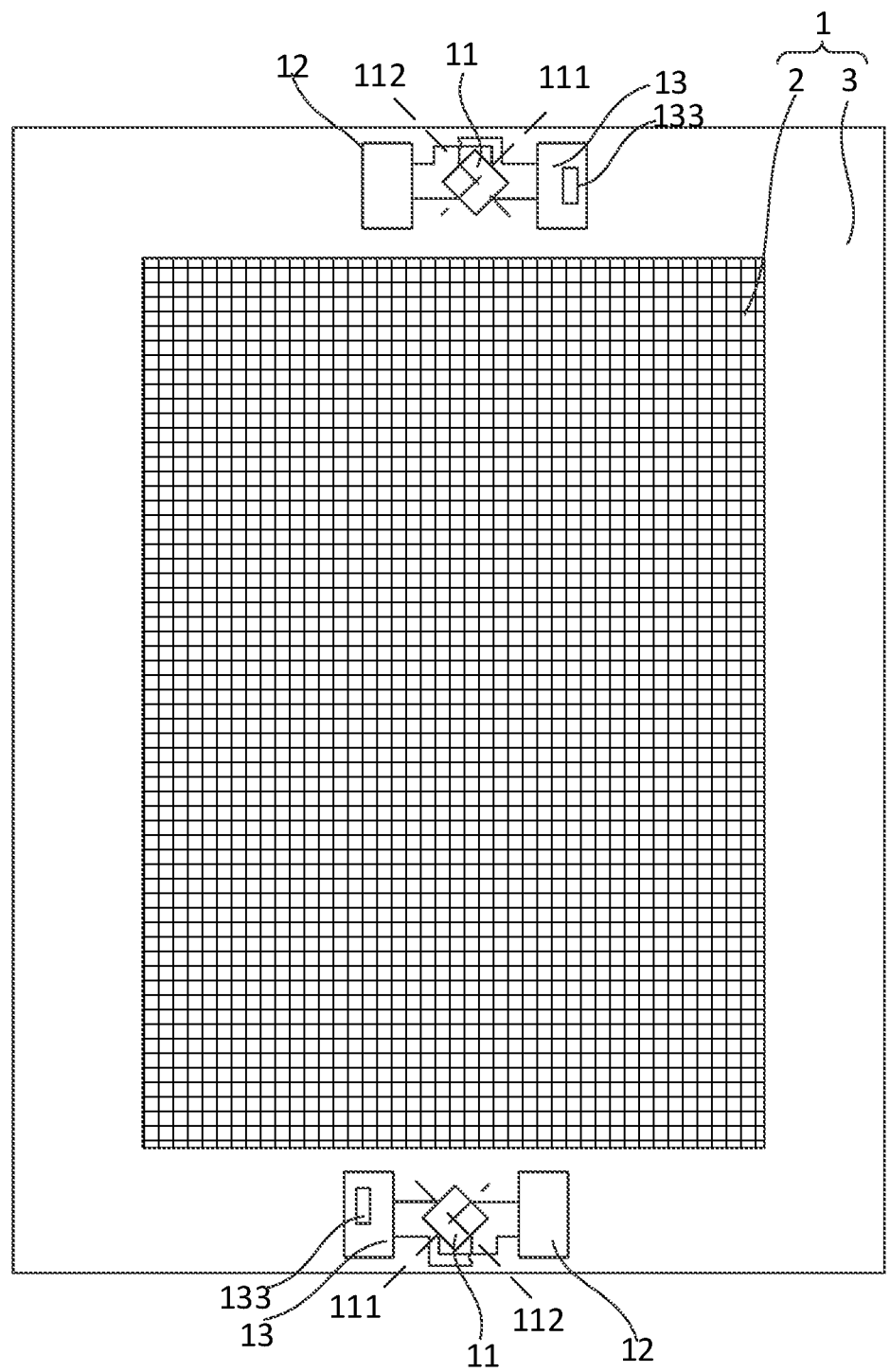
FIG. 6 is a structure schematic diagram showing another touch substrate provided by an embodiment of the disclosure.

FIG. 6 is a structure schematic diagram of another touch substrate provided by the embodiment. Compared with the FIG. 1, the voltage detecting circuits provided in FIG. 6 also include subtraction circuits. The touch substrate 1 includes a display region 2 and a non-display region 3 around the display region 2. The non-display region 3 is internally provided with at least two semiconductor pressure sensors 11, bias voltage applying circuits 12 and voltage detecting circuits 13. The voltage detecting circuits 13 also include subtraction circuits 133 arranged in the non-display region 3 of the touch substrate 1.

Figure 7:
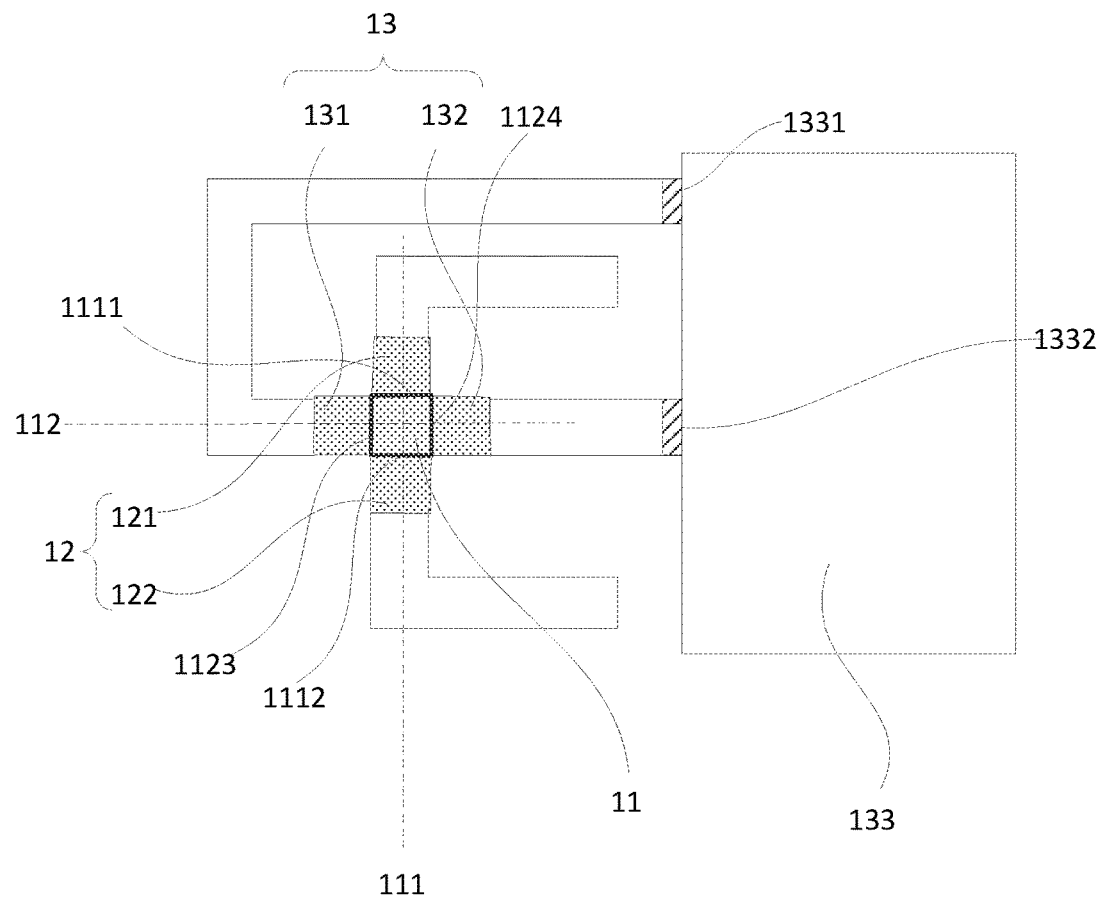
FIG. 7 is a connecting schematic diagram showing a pressure sensor configured on the touch substrate in FIG. 6.

FIG. 7 is a connecting schematic diagram of the pressure sensor configured on the touch substrate in FIG. 6. The bias voltage applying circuit 12 is respectively electrically connected with the first connecting terminal 1111 and the second connecting terminal 1112 of the semiconductor pressure sensor 11, and is used for applying bias voltage to the semiconductor pressure sensor 11. The voltage detecting circuit 13 is respectively electrically connected with the third connecting terminal 1123 and the fourth connecting terminal 1124 of the semiconductor pressure sensor 11, and is used for acquiring the strain voltage on the semiconductor pressure sensor 11. The first straight line 111 of the first connecting terminal 1111 and the second connecting terminal 1112 intersects the second straight line 112 of the third connecting terminal 1123 and the fourth connecting terminal 1124, The first input terminal 1331 of the subtraction circuit 133 is electrically connected with the third electrode 131. The second input terminal 1332 of the subtraction circuit 133 is electrically connected with the fourth electrode 132, and is used for acquiring the strain voltage difference of the semiconductor pressure sensor 11.

Figure 8:
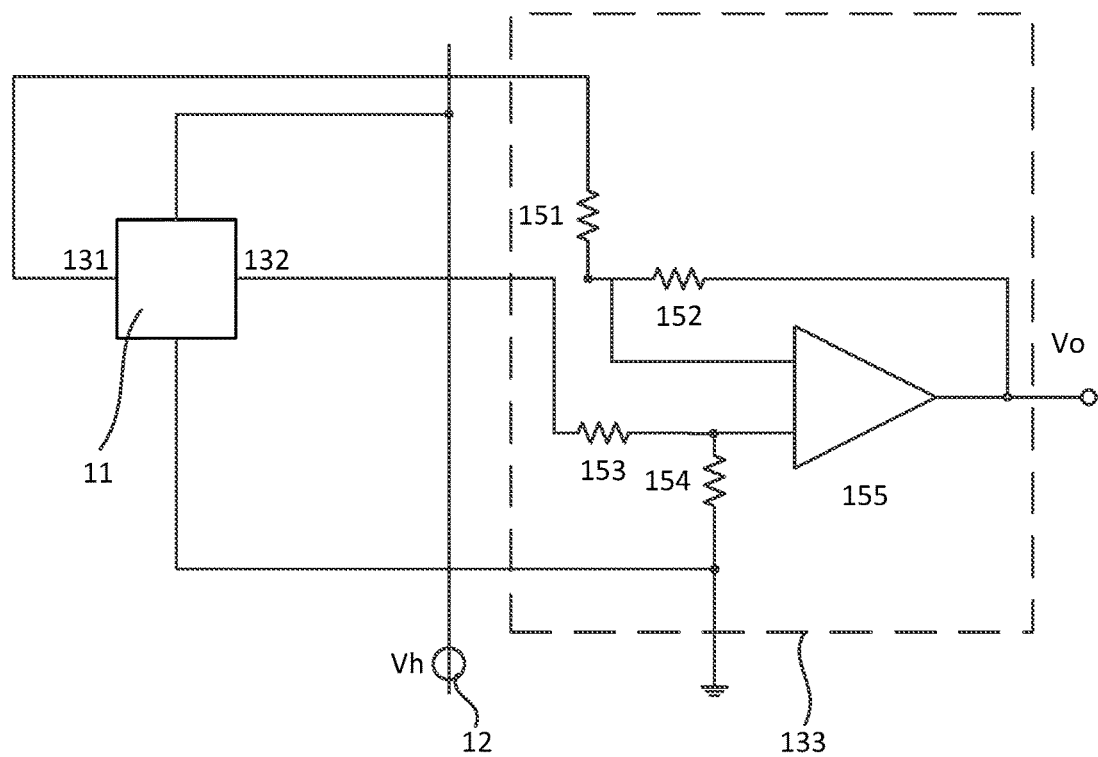
FIG. 8 is a connecting schematic diagram showing a semiconductor pressure sensor and a subtraction circuit.

Specifically, circuits capable of acting as subtraction circuits are multiple. The embodiment of the disclosure illustratively provides a subtraction circuit shown in FIG. 8. In FIG. 8, an equivalent circuit diagram of the pressure sensor and a subtraction circuit electrically connected with the pressure sensor are shown. The subtraction circuit 133 includes a first resistor 151, a second resistor 152, a third resistor 153, a fourth resistor 154 and an operational amplifier 155. The first terminal of the first resistor 151 is electrically connected with the third electrode 131. The second terminal of the first resistor 151 is respectively electrically connected with an inverting input terminal of the operational amplifier 155 and the first terminal of the second resistor 152. The second terminal of the second resistor 152 is electrically connected with an output terminal of the operational amplifier 155. The first terminal of the third resistor 153 is electrically connected with the fourth electrode 132. The second terminal of the third resistor 153 is electrically connected with a non-inverting input terminal of the operational amplifier 145 and the first terminal of the fourth resistor 154. The second terminal of the fourth resistor 154 is grounded.

According to the technical scheme provided by the embodiment, the voltage detecting circuit is internally provided with a subtraction circuit, and the strain voltage difference between the third electrode and the fourth electrode of the pressure sensor can be obtained by calculating via the subtraction circuit. The amount of the touch pressure can be obtained by calculating the strain voltage difference between the third electrode and the fourth electrode of the pressure sensor by the processor connected with the voltage detecting circuit, and further the processing efficiency of the processor is enhanced.

Further, the semiconductor pressure sensor 11 is made from an amorphous silicon material film or a polycrystalline silicon material film. If the semiconductor pressure sensor is made from the polycrystalline silicon material film, in an embodiment, the polycrystalline silicon material film has the thickness of 10 nm-200 nm. The polycrystalline silicon material membrane can be doped when being utilized in manufacturing the semiconductor pressure sensor. In a embodiment, the area doping concentration of the polycrystalline silicon material film is 1010/cm2~1015/cm2. It should be understood by a person skilled in the art that the factors for affecting the piezoresistive effect of the polycrystalline silicon material are mainly two: one is the integral geometric deformation situation of a silicon diagram from a macroscopic aspect, and the other is the crystal lattice stress situation of a polycrystalline crystal from the microscopic aspect. The resistance change caused by the crystal lattice stress is far greater than the resistance change caused by the integral geometric deformation of the silicon diagram. The aim of recognizing the amount of touch pressure is realized by the semiconductor pressure sensor through utilizing the resistance change caused by the crystal lattice stress of polycrystal silicon of the semiconductor pressure sensor in the technical scheme provided by the embodiment of the disclosure, and the polycrystalline silicon material film with the thickness and the face doping concentration above are adopted, thereby not only guaranteeing that the strain resistance value cannot be too great, in favor of transmitting and detecting signals, but also preventing the crystal lattice structure of the polycrystalline silicon from being damaged. Typically, the semiconductor pressure sensor is of P type doped or N type doped.

It should be noted that in the technical scheme provided by the embodiment of the disclosure, the first electrode, the second electrode, the third electrode and the fourth electrode which are electrically connected with the semiconductor pressure sensor can be made from metal, also can be made from the amorphous silicon material or polycrystalline silicon material. But considering that if the first electrode, the second electrode, the third electrode and the fourth electrode are made of metal, schottky barrier usually is formed between the semiconductor pressure sensor and the first electrode, the second electrode, the third electrode and the fourth electrode, and can increase the resistance value of the strain resistor of the semiconductor pressure sensor, which does not facilitate to the recognition of the touch pressure of the semiconductor pressure sensor. In an embodiment, the first electrode, the second electrode, the third electrode and the fourth electrode are made from the amorphous silicon material, and or are made from the polycrystalline silicon material, and are same with the doping type of the semiconductor pressure sensor. In another embodiment, the doping concentrations of the first electrode, the second electrode, the third electrode and the fourth electrode are all greater than that of the semiconductor pressure sensor, so that the schottky barrier can be reduced effectively, and the strain voltage outputted by the third electrode and the fourth electrode are mainly attributed to the impedance change of the semiconductor sensor.

Figure 9:
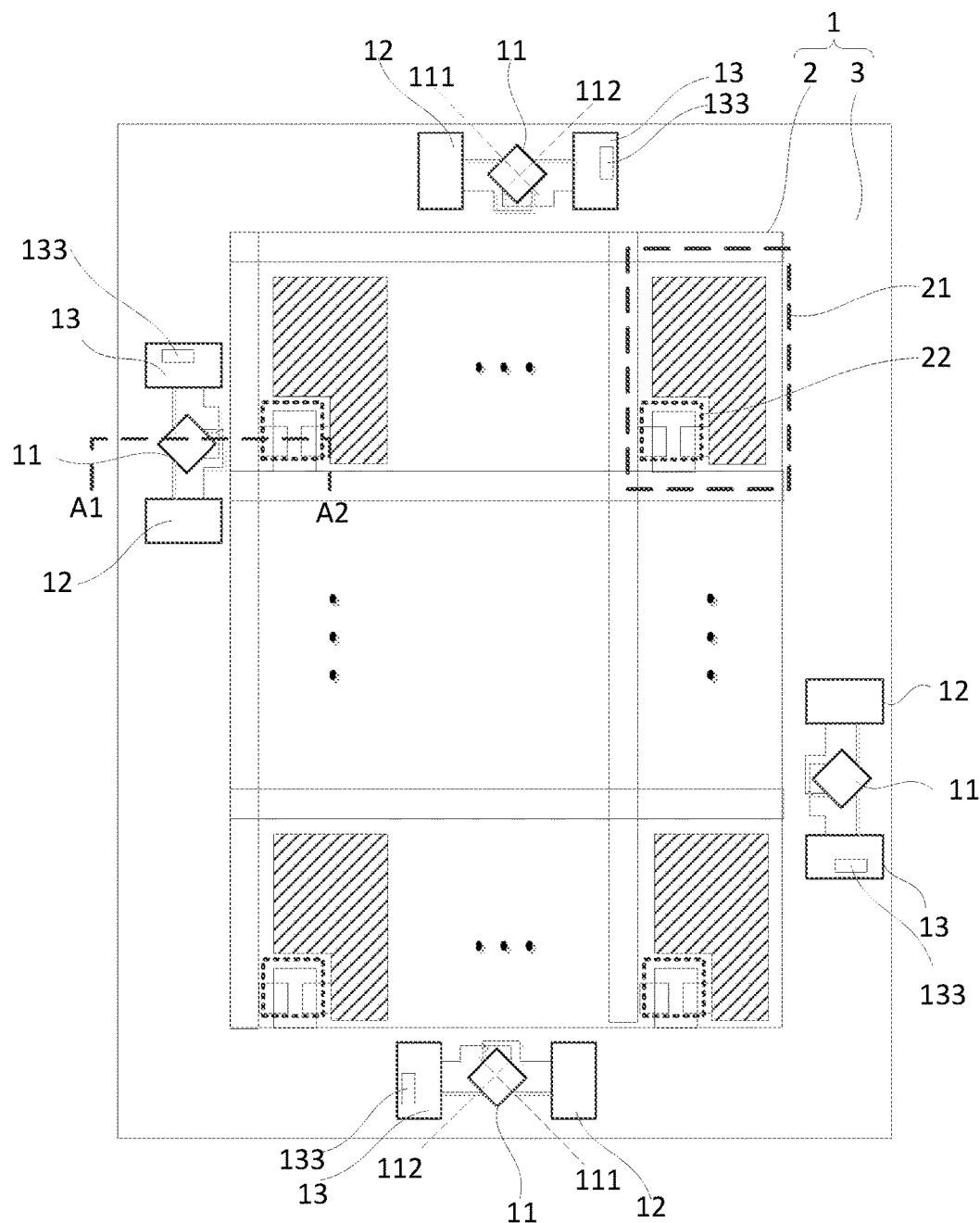
FIG. 9 is a structure schematic diagram showing another touch substrate provided by an embodiment of the disclosure.
Figure 10:
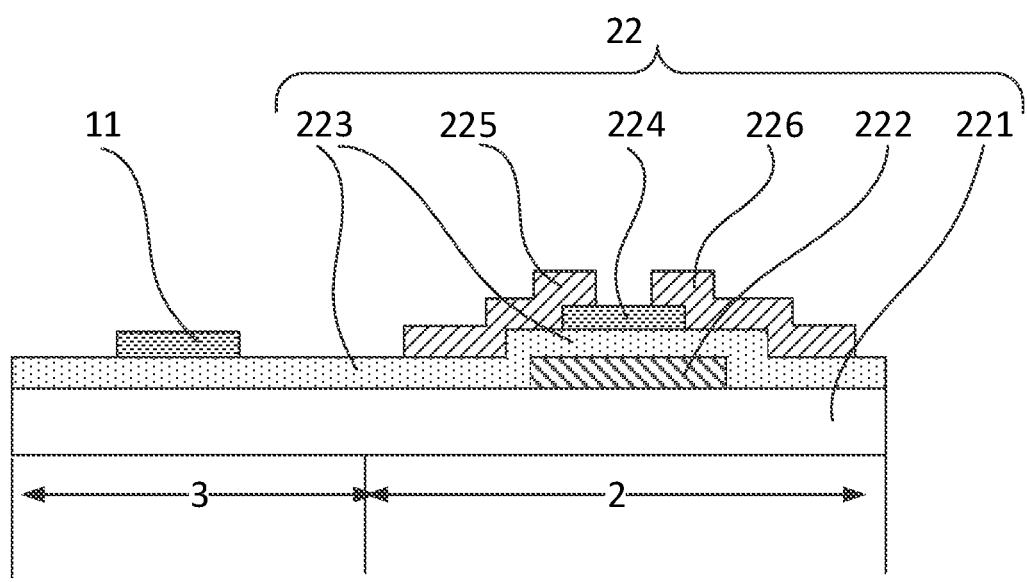
FIG. 10 is a cross sectional view of the touch substrate provided in FIG. 9 along A1-A2.

FIG. 9 is a structure schematic diagram of another touch substrate provided by the embodiment of the disclosure. The touch substrate provided by the FIG. 9 is a specific example of the touch substrate provided by FIG. 1. Compared with FIG. 1, in FIG. 9, the touch substrate is specified as an array substrate. FIG. 10 is a cross-sectional view of the touch substrate provided in FIG. 9 along A1-A2. Specifically, the touch substrate 1 is an array substrate including a display region 2 and a non-display region 3 around the display region 2. The display region 2 is formed by the arrangement of a plurality of pixel units 21 according to a matrix mode, and each pixel unit is internally provided with a thin film transistor 22. The thin film transistor 22 includes a gate electrode 222 arranged on a substrate 221, a gate insulation layer 223 arranged on the gate electrode 222, an active layer 224 arranged on the gate insulation layer 223, a source electrode 225 and a drain electrode 226 arranged on the active layer 224. The non-display region 3 is provided with at least two semiconductor pressure sensors 11, bias voltage applying circuits 12 and voltage detecting circuits 13. In the embodiment, the specific connection relationship among the at least two semiconductor pressure sensors 11, bias voltage applying circuits 12 and voltage detecting circuits 13 is described above, and will not be described here in detail.

It should be noted that, in the embodiment shown in FIG. 9 and FIG. 10, the substrate 221 may be a rigid glass substrate or a bendable flexible substrate. The flexible substrate include, but is not limited to, plastic material. The flexible substrate may further include one or more of polyethylene, polypropylene, polystyrene, polyethylene terephthalate, polyethersulfone, polyethylene naphthalate, and polyimide.

Considering that the active layer 224 in the thin film transistor in the array substrate is made from the silicon material film, and in an embodiment, the display region 2 of the array substrate is provided with a thin film transistor 22 including an active layer 24 which is in the same layer with the semiconductor pressure sensor 11, i.e., in the process of manufacturing the array substrate, the active layer 224 in the film transistor 22 and the semiconductor pressure sensor 11 are made from the same material and are formed simultaneously in the same manufacturing step. Therefore, a silicon material film manufacturing process can be reduced effectively, the process of the array substrate is simplified, and the process cost is reduced.

Further, because the array substrate is provided with a display drive circuit, in an embodiment, the non-display region of the array substrate is provided with a display drive circuit. At least one of the first electrode and the second electrode in the bias voltage applying circuit is electrically connected with a signal line in the display drive circuit so as to apply bias voltage to the semiconductor pressure sensor. For example, the first electrode in the bias voltage applying circuit is electrically connected with a common voltage signal line, and the second electrode in the bias voltage applying circuit is electrically connected with a grounding line, so that the bias voltage is formed in the first electrode and the second electrode, and is applied to the semiconductor pressure sensor. Therefore, a power supply for applying the bias voltage is not required to be additionally arranged in the bias voltage applying circuit, so that not only can cost be reduced, but also the semiconductor pressure sensor can be integrated to the array substrate.

Figure 11:
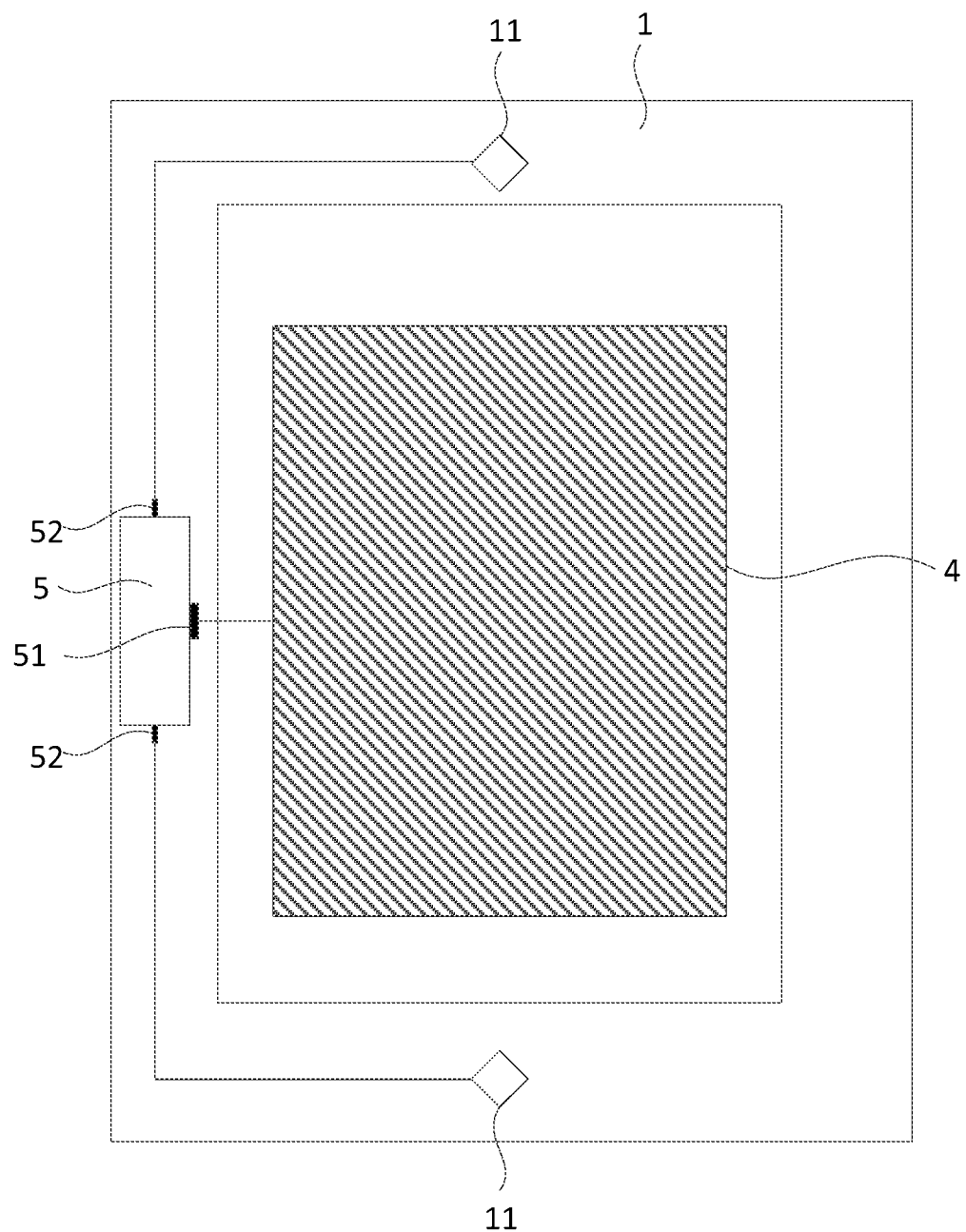
FIG. 11 is a structure schematic diagram showing a touch display panel provided by an embodiment of the disclosure.

The embodiment of the disclosure also provides a touch display panel. FIG. 11 is a structure schematic diagram of the touch display panel provided by the embodiment of the disclosure. The touch display panel includes a touch substrate 1 provided by the embodiment of the disclosure and a touch detecting circuit 4. The touch detecting circuit 4 is used for acquiring a touch detecting signal on the touch display panel. In specific design, the touch display panel can be a resistive touch display panel, a capacitive touch display panel or an optical touch display panel. Structures of touch detecting circuits 4 of different touch display panels are different, which is the prior art, and will not be described in detail.

Generally, the touch display panel is formed by stacking two or more substrates sequentially. The touch display panel further includes a counter substrate opposite to the touch substrates.

In an exemplary embodiment, the touch display panel is a liquid crystal display panel, the touch substrate is an array substrate, and the counter substrate is a color filter substrate. The touch detecting circuit 4 may be arranged on the array substrate or arranged on the counter substrate.

In an alternative embodiment, the touch display panel is an organic light emitting display panel, the touch substrate is an array substrate where the organic light emitting diodes are arranged, and the counter substrate is a cover plate (such as a glass substrate). The touch detecting circuit 4 may be arranged on the array substrate or arranged on the counter substrate.

It should be noted that, alternatively, the touch display panel also includes a processor 5, where a first input terminal 51 of the processor 5 is electrically connected with the touch detecting circuit 4; a second input terminal 52 of the processor 5 is respectively electrically connected with a third electrode and a fourth electrode of a voltage detecting circuit (not shown in FIG. 11), or when the non-display region of the touch substrate 1 is also provided with a subtraction circuit, a second input terminal 52 of the processor is electrically connected with an output terminal of the subtraction circuit; the processor 5 is used for acquiring touch position information of the touch display panel according to the touch detecting signal, and calculating according to the touch position information of the touch display panel and the strain voltage difference of the semiconductor pressure sensor 11 so as to obtain the amount of touch pressure.

Figure 12:
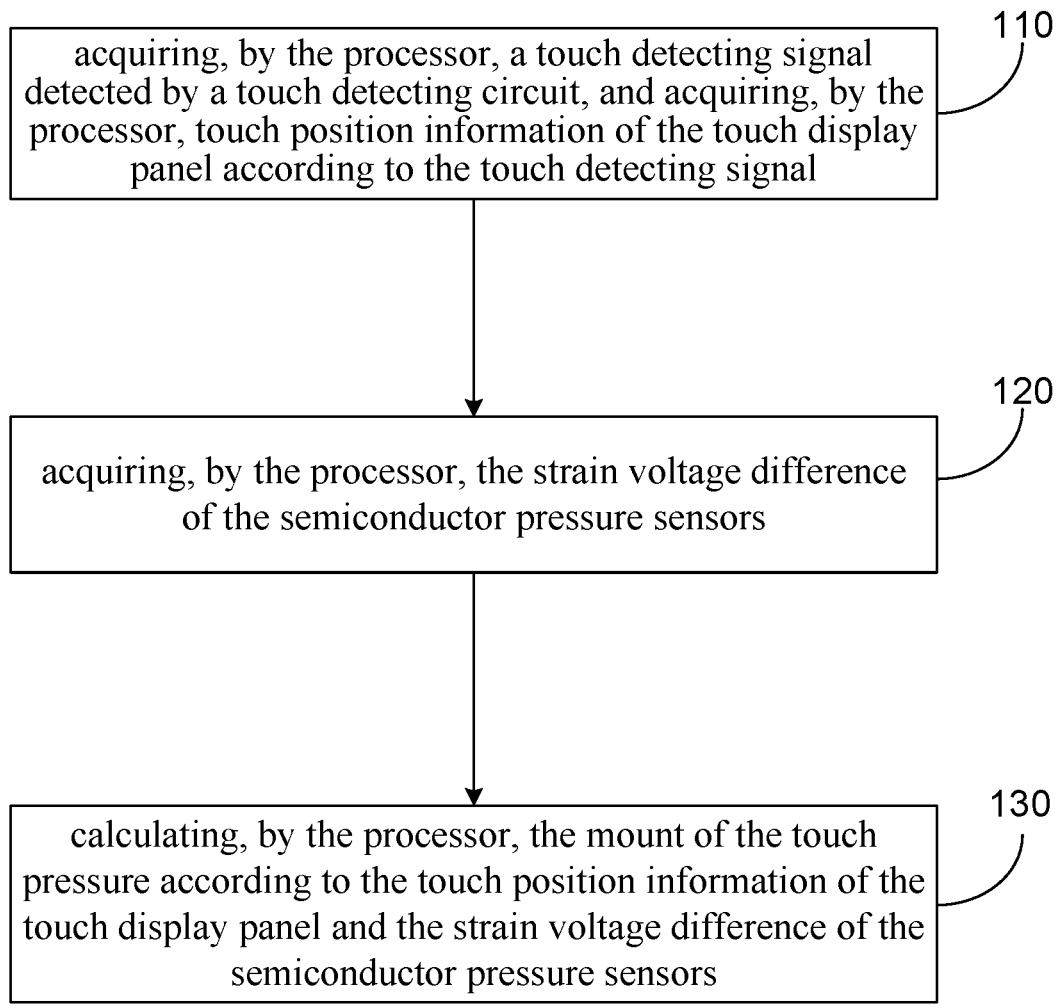
FIG. 12 is a flow chart of a touch pressure calculating method provided by an embodiment of the disclosure.

The embodiment of the disclosure also provides a touch pressure calculating method. FIG. 12 is a flow chart of the touch pressure calculating method provided by the disclosure. The touch pressure calculating method provided by the disclosure is suitable for recognizing the touch position information inputted by users when users touch the touch display panel provided by the embodiment of the disclosure, and calculating the amount of the touch pressure. The touch pressure calculating method includes: S110, S120 and S130.

In S110, a processor acquires a touch detecting signal detected by a touch detecting circuit, and acquires the touch position information of the touch display panel according to the touch detecting signal.

If the touch display panel is a resistive touch display panel, the touch detecting circuit detects the variation of each resistor in the touch display panel, and the variation is touch detecting signals. After the processor acquires the touch detecting signals detected by the touch detecting circuit, according to the touch detecting signals and the preset touch position calculating method, the x-coordinate value and y-coordinate value of the specific touch position are obtained by calculating in the process of touching the touch display panel by users, and act as the touch position information of the touch display panel.

If the touch display panel is a capacitive touch display panel, the touch detecting circuit detects the capacitance variation of a coupling capacitor or a parasitic capacitor, and the capacitance variation is touch detecting signals. After the processor acquires the touch detecting signals detected by the touch detecting circuit, according to the touch detecting signals and the preset touch position calculating method, the x-coordinate value and y-coordinate value of the specific touch position are obtained by calculating in the process of touching the touch display panel by users, and act as the touch position information of the touch display panel.

If the touch display panel is an optical touch display panel, the touch detecting circuit acquires a sending terminal and a receiving terminal of a light ray blocked by users in the process of touching the touch display panel by users, and the sending terminal and the receiving terminal of the light ray blocked by users is touch detecting signals. After the processor acquires the touch detecting signals detected by the touch detecting circuit, according to the touch detecting signals and the preset touch position calculating method, the x-coordinate value and y-coordinate value of the specific touch position are obtained by calculating in the process of touching the touch display panel by users, and act as the touch position information of the touch display panel.

In S120. The processor acquires the strain voltage difference of the semiconductor pressure sensors;

In an embodiment, the voltage detecting circuit connected with the semiconductor pressure sensor in the touch display panel does not include a subtraction circuit. Meanwhile, the processor acquires the strain voltage of the third electrode and the strain voltage of the fourth electrode of the semiconductor pressure sensor, which is acquired by the voltage detecting circuit, and calculates according to the respective strain voltage of the third electrode and the fourth electrode to obtain the strain voltage difference between the third electrode and the fourth electrode.

In another embodiment, the voltage detecting circuit connected with the semiconductor pressure sensor in the touch display panel includes a subtraction circuit. Meanwhile, the subtraction circuit calculates according to the strain voltage acquired by the third electrode and the fourth electrode to obtain the strain voltage difference between the third electrode and the fourth electrode. The processor directly acquires the strain voltage difference output by the subtraction circuit.

In S130, the processor calculates to obtain the touch pressure according to the touch position information of the touch display panel and the strain voltage difference of the semiconductor pressure sensors.

After the touch position information of the touch display panel and the strain voltage difference of the semiconductor pressure sensor are acquired, according to the calculating principle of the touch position information of the touch display panel, the strain voltage difference of the semiconductor pressure sensor and the preset touch pressure, the processor calculates to obtain the amount of the touch pressure.

The above touch pressure calculating method can be used for recognizing the touch position information of the touch display panel provided by any embodiment of the disclosure, and calculating the amount of the touch pressure, and has the beneficial effects of the touch display panel provided by the embodiment.

It should be noted that the content above is merely the preferable embodiments and the applied technical principle of the disclosure. It should be understood by a person skilled in the art that the disclosure is not limited to the specific embodiments, and various obvious modifications, readjustment and substitutions can be made without departing from the protection scope of the disclosure for the person skilled in the art. Therefore, although the disclosure is described in detail by the embodiments above, the disclosure is not merely limited thereto, and also can include other more equivalent embodiments without departing from the concept of the disclosure. The scope of the disclosure is determined by the scope of the attached claims.

We claim:

1. An array substrate, comprising:
   a display region with a non-display region around the display region;
   thin film transistors in the display region and having an active layer;
   at least two semiconductor pressure sensors, each of which has a first connecting terminal, a second connecting terminal, a third connecting terminal and a fourth connecting terminal, wherein a first straight line connecting the first connecting terminal and the second connecting terminal intersects a second straight line connecting the third connecting terminal and the fourth connecting terminal;
   a bias voltage applying circuit, wherein the bias voltage applying circuit is electrically connected to the first connecting terminals and the second connecting terminals of the at least two semiconductor pressure sensors, and is adapted for applying a bias voltage to each of the at least two semiconductor pressure sensors; and
   a voltage detecting circuit, wherein the voltage detecting circuit is electrically connected to the third connecting terminals and the fourth connecting terminals of the at least two semiconductor pressure sensors, and is adapted for acquiring a strain voltage between the third connecting terminal and the fourth connecting terminal of each of the at least two semiconductor pressure sensors,
   wherein each of the at least two semiconductor pressure sensors is a semiconductor film in a polygonal structure having at least four sides, the active layer and the semiconductor film are in a same layer.

2. The array substrate according to claim 1, wherein
   the bias voltage applying circuit comprises a first electrode and a second electrode, wherein the first electrode is electrically connected to the first connecting terminal, and the second electrode is electrically connected to the second connecting terminal; and
   the voltage detecting circuit comprises a third electrode and a fourth electrode, wherein the third electrode is electrically connected to the third connecting terminal, and the fourth electrode is electrically connected to the fourth connecting terminal, the first electrode and the second electrode are used for applying bias voltages to the semiconductor pressure sensors and the third electrode and the fourth electrode are used for acquiring strain voltages of the semiconductor pressure sensors.

3. The array substrate according to claim 2, wherein each of the first connecting terminal, the second connecting terminal, the third connecting terminal and the fourth connecting terminal of each semiconductor pressure sensor is arranged on a respective one of the at least four sides.

4. The array substrate according to claim 1, wherein the first straight line and the second straight line are perpendicular.

5. The array substrate according to claim 1, wherein the display region is rectangular, and each side of the display region is provided with at least one semiconductor pressure sensor.

6. The array substrate according to claim 1, wherein an edge of the array substrate adjacent to one of the at least two semiconductor pressure sensors and the first straight line form an angle of 10 degrees to 80 degrees.

7. The array substrate according to claim 1, wherein the voltage detecting circuit further comprises a subtraction circuit arranged in the non-display region,
   wherein a first input terminal of the subtraction circuit is electrically connected to the third electrode, a second input terminal of the subtraction circuit is electrically connected to the fourth electrode, and the subtraction circuit is configured to acquire the strain voltage difference of the semiconductor pressure sensor connected to the subtraction circuit.

8. The array substrate according to claim 7, wherein the subtraction circuit comprises a first resistor, a second resistor, a third resistor, a fourth resistor and an operational amplifier,
   wherein a first terminal of the first resistor is electrically connected to the third electrode; a second terminal of the first resistor is electrically connected to an inverting input terminal of the operational amplifier; a first terminal of the second resistor is electrically connected to the inverting input terminal of the operational amplifier; a second terminal of the second resistor is electrically connected to an output terminal of the operational amplifier; a first terminal of the third resistor is electrically connected to the fourth electrode; a second terminal of the third resistor is electrically connected to a non-inverting input terminal of the operational amplifier; a first terminal of the fourth resistor is electrically connected to the non-inverting input terminal of the operational amplifier; and a second terminal of the fourth resistor is grounded.

9. The array substrate according to claim 7, wherein the semiconductor film is an amorphous silicon film or a polycrystalline silicon film.

10. The array substrate according to claim 9, wherein a thickness of the polycrystalline silicon film is 10 nm-200 nm.

11. The array substrate according to claim 10, wherein the area doping concentration of the polycrystalline film is $10^{10}$ cm$^2$~$10^{15}$ cm$^2$.

12. The array substrate according to claim 9, wherein the semiconductor film is doped with N dopants or P dopants.

13. The array substrate according to claim 9, wherein the first electrode, the second electrode, the third electrode and the fourth electrode are made from an amorphous silicon material film or a polycrystalline silicon film, and all of the first electrode, the second electrode, the third electrode and the fourth electrode have a doping type that is the same as a doping type of the semiconductor pressure sensors.

14. The array substrate according to claim 13, wherein the doping concentrations of the first electrode, the second electrode, the third electrode and the fourth electrode are all greater than the doping concentrations of the semiconductor pressure sensors.

15. The array substrate according to claim 1, wherein the non-display region is provided with a display drive circuit, wherein the bias voltage applying circuit comprises a first electrode electrically connected to the first connecting terminal and a second electrode electrically connected to the second connecting terminal, wherein at least one of the first electrode and the second electrode of the bias voltage applying circuit is electrically connected to a signal line of the display drive circuit so as to apply bias voltage to the semiconductor pressure sensors.

16. A touch display panel, comprising:
    an array substrate and a touch detecting circuit, wherein the touch detecting circuit is configured to acquire a touch detecting signal of the touch display panel, wherein the array substrate comprises:

a display region with a non-display region around the display region;

thin film transistors in the display region and having an active layer;

at least two semiconductor pressure sensors, each of which has a first connecting terminal, a second connecting terminal, a third connecting terminal and a fourth connecting terminal, wherein a first straight line connecting the first connecting terminal and the second connecting terminal intersects a second straight line connecting the third connecting terminal and the fourth connecting terminal;

a bias voltage applying circuit, wherein the bias voltage applying circuit is electrically connected to the first connecting terminals and the second connecting terminals of the at least two semiconductor pressure sensors, and is adapted for applying a bias voltage to each of the at least two semiconductor pressure sensors; and a voltage detecting circuit, wherein the voltage detecting circuit is electrically connected to the third connecting terminals and the fourth connecting terminals of the at least two semiconductor pressure sensors, and is adapted for acquiring a strain voltage between the third connecting terminal and the fourth connecting terminal of each of the at least two semiconductor pressure sensors, wherein each of the at least two semiconductor pressure sensors is a semiconductor film in a polygonal structure having at least four sides, the active layer and the semiconductor film are in a same layer.

17. The touch display panel according to claim 16, further comprising a counter substrate opposite to the array substrate, wherein the touch detecting circuit is arranged on the array substrate or arranged on the counter substrate.

18. The touch display panel according to claim 16, further comprising a processor, wherein the bias voltage applying circuit comprises a first electrode electrically connected to the first connecting terminal and a second electrode electrically connected to the second connecting terminal;

wherein the voltage detecting circuit comprises a third electrode electrically connected to the third connecting terminal and a fourth electrode electrically connected to the fourth connecting terminal;

wherein a first input terminal of the processor is electrically connected to the touch detecting circuit, and a second input terminal of the processor is electrically connected to the third electrode and the fourth electrode of the voltage detecting circuit;

the processor is configured to acquire touch position information of the touch display panel according to the touch detecting signal, and calculate a touch pressure according to the touch position information of the touch display panel and the strain voltage difference of the semiconductor pressure sensors.

19. The touch display panel according to claim 18, wherein the voltage detecting circuit further comprises a subtraction circuit arranged in the non-display region configured to acquire the strain voltage difference of the semiconductor pressure sensor connected to the subtraction circuit, a first input terminal of the subtraction circuit is electrically connected to the third electrode, and a second input terminal of the subtraction circuit is electrically connected to the fourth electrode, wherein the second input terminal of the processor is electrically connected with an output terminal of the subtraction circuit.

20. A method for calculating touch pressure of the touch display panel according to claim 18, comprising:

acquiring, by the processor, a touch detecting signal detected by the touch detecting circuit, and acquiring, by the processor, touch position information of the touch display panel according to the touch detecting signal;

acquiring, by the processor, the strain voltage difference of the semiconductor pressure sensor; and calculating, by the processor, the amount of the touch pressure according to the touch position information of the touch display panel and the strain voltage difference of the semiconductor pressure sensor.

* * * * *